United States Patent
Bao

(10) Patent No.: US 11,862,513 B2
(45) Date of Patent: Jan. 2, 2024

(54) MANUFACTURING METHOD OF SEMICONDUCTOR STRUCTURE

(71) Applicant: CHANGXIN MEMORY TECHNOLOGIES, INC., Anhui (CN)

(72) Inventor: Xifei Bao, Anhui (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 323 days.

(21) Appl. No.: 17/449,555

(22) Filed: Sep. 30, 2021

(65) Prior Publication Data

US 2022/0020630 A1 Jan. 20, 2022

Related U.S. Application Data

(63) Continuation of application No. PCT/CN2021/103708, filed on Jun. 30, 2021.

(30) Foreign Application Priority Data

Jul. 14, 2020 (CN) .......................... 202010672968.4

(51) Int. Cl.
*H01L 21/768* (2006.01)
*H10B 12/00* (2023.01)

(52) U.S. Cl.
CPC ...... *H01L 21/7681* (2013.01); *H01L 21/7688* (2013.01); *H01L 21/76843* (2013.01); *H01L 21/76865* (2013.01); *H10B 12/02* (2023.02)

(58) Field of Classification Search
CPC .......... H01L 21/7681; H01L 21/76843; H01L 21/76865; H01L 21/7688; H01L 21/0337; H01L 21/31144; H01L 28/90; H10B 12/02; H10B 12/03
See application file for complete search history.

(56) References Cited

U.S. PATENT DOCUMENTS 7,446,049 B2 11/2008 Kim

FOREIGN PATENT DOCUMENTS

| CN | 100547729 C | 10/2009 |
|---|---|---|
| CN | 107895721 A | 4/2018 |
| CN | 109119330 A | 1/2019 |
| CN | 109390216 A | 2/2019 |
| CN | 110233097 A | 9/2019 |
| CN | 110634733 A | 12/2019 |
| KR | 20100073099 A | 7/2010 |

*Primary Examiner* — Robert G Bachner
(74) *Attorney, Agent, or Firm* — Syncoda LLC; Feng Ma

(57) ABSTRACT

A manufacturing method of a semiconductor structure includes the following steps. A substrate is provided. A barrier layer is formed on the substrate. A sacrificial layer is formed on the barrier layer. An opening pattern is formed over the sacrificial layer by utilizing a photolithography process. The sacrificial layer is etched according to the opening pattern to form first trenches by using the barrier layer as an etch stop layer. A medium layer material is filled in the first trenches. The sacrificial layer is etched to form second trenches by using the barrier layer as the etch stop layer. A hard mask layer material is filled in the second trenches. The medium layer material is etched to form a hard mask layer by using the barrier layer as the etch stop layer.

12 Claims, 7 Drawing Sheets

MANUFACTURING METHOD OF SEMICONDUCTOR STRUCTURE

CROSS-REFERENCE TO RELATED APPLICATIONS

This is a continuation of International Patent Application No. PCT/CN2021/103708, filed on Jun. 30, 2021, which claims priority to Chinese Patent Application No. 202010672968.4 filed on Jul. 14, 2020. The disclosures of these applications are hereby incorporated by reference in their entirety.

BACKGROUND

A storage unit of a Dynamic Random-Access Memory (DRAM) includes a capacitor configured to store charges and a transistor used as a switch. As a geometric size of the storage unit of the DRAM decreases increasingly according to Moore's Law, the aspect ratio of the capacitor gradually increases.

SUMMARY

The embodiments of the present disclosure relate to a manufacturing method of a semiconductor structure.

The embodiments of the present disclosure provide a manufacturing method of a semiconductor structure, which includes the following steps. A substrate is provided. A barrier layer is formed on the substrate. A sacrificial layer is formed on the barrier layer. An opening pattern is formed over the sacrificial layer by utilizing a photolithography process. The sacrificial layer is etched according to the opening pattern by taking the barrier layer as an etch stop layer to form first trenches. A medium layer material is filled in the first trenches. The sacrificial layer is etched by taking the barrier layer as the etch stop layer, to form second trenches. A hard mask layer material is filled in the second trenches. The medium layer material is etched by taking the barrier layer as the etch stop layer, to form a hard mask layer.

BRIEF DESCRIPTION OF THE DRAWINGS

One or more embodiments are illustrated by corresponding figures in the drawings. These illustrations do not limit the embodiments, and elements with the same reference numbers in the drawings are denoted as similar elements. Unless otherwise stated, the figures in the drawings do not limit the scale.

DETAILED DESCRIPTION

Figure 1:
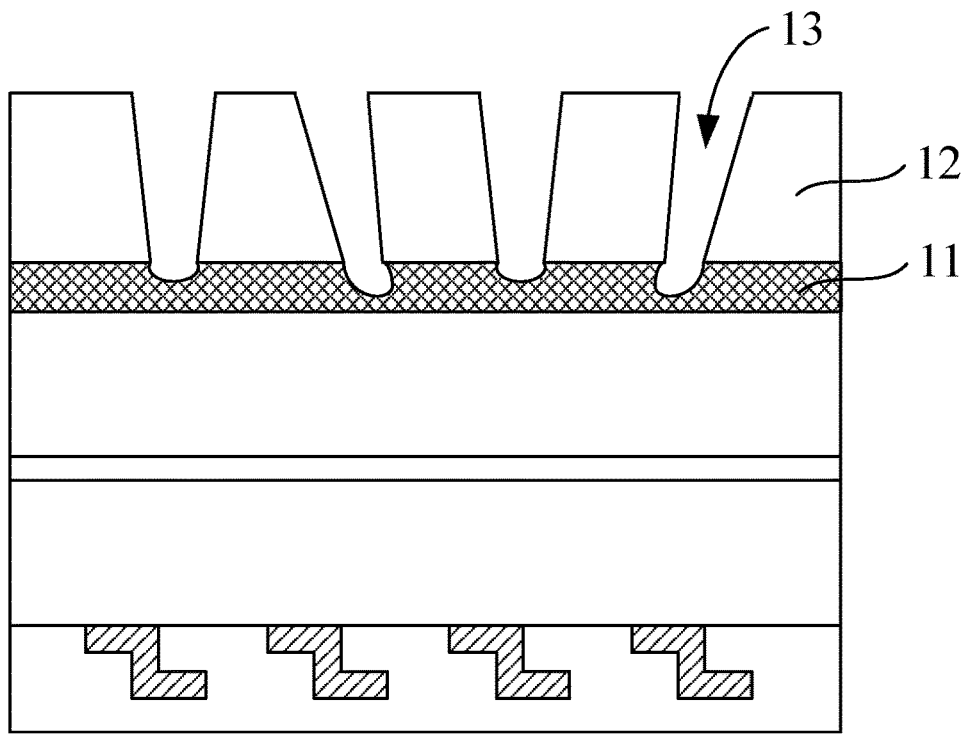
FIG. 1 is a schematic sectional view of a semiconductor structure.

Reference is made to FIG. 1, which is a schematic cross-sectional view of a semiconductor structure. The semiconductor structure includes a medium layer 11 and a hard mask layer 12 on the medium layer. The same etching process has a relatively small etch selectivity ratio of the hard mask layer 12 and the medium layer 11, and the hard mask layer 12 has a higher hardness and a larger thickness.

In the process of etching the hard mask layer 12 to form an opening pattern 13, since the hard mask layer 12 has a higher hardness and a larger thickness, it is easy to cause sidewalls of the opening patterns 13 finally formed by etching to be not perpendicular to a surface of the medium layer 11. When such opening patterns 13 with etching defects are used for selective etching to form a plurality of discrete capacitor holes, a problem of penetration between adjacent capacitor holes may occur.

Further, since the same etching process has a relatively small etch selectivity ratio of the hard mask layer 12 and the medium layer 11, after the opening patterns 13 are formed by etching, excess etchant is in contact with the medium layer 11, thereby causing etching by mistake of the medium layer 11. The etching by mistake may cause changes in performance of the medium layer 11, such as weakening of the supporting capacity, damage to electronic components inside the medium layer 11, or the like.

In order to solve the above-mentioned problems, the embodiments of the present disclosure provide a manufacturing method of a semiconductor structure. The difficulty of etching is adjusted by controlling the material of a sacrificial layer to ensure that first trenches formed by etching has a preset topography, so that second trenches that are formed subsequently and complementary to the first trenches and the hard mask layer that fills the second trenches have a preset topography. Further, a barrier layer formed on the substrate, which may be used as an etch stop layer, facilitates avoiding etching damage to the substrate caused by the same etching process.

In order to make the objectives, technical solutions, and advantages of the embodiments of the present disclosure clearer, embodiments of the present disclosure will be described below in detail in combination with the drawings. However, those of ordinary skill in the art can understand that, in each embodiment of the present disclosure, many technical details are proposed to make readers understand the present disclosure better. However, the technical solutions claimed by the present disclosure may also be implemented even if without these technical details and various variations and modifications made based on the following embodiments.

FIG. 2 to FIG. 11 are schematic diagrams of sectional structures corresponding to steps of a manufacturing method of a semiconductor structure provided in an embodiment of the present disclosure. Details are as follows.

Figure 2:
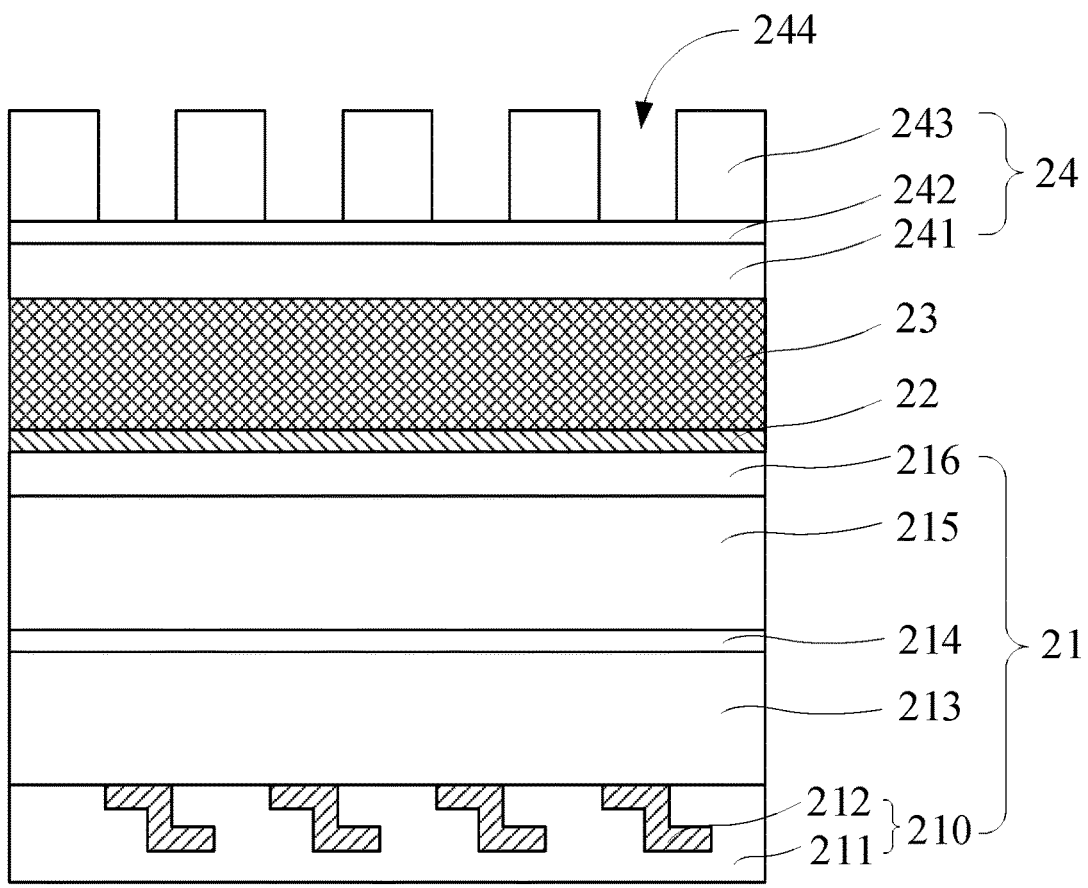
FIG. 2 is a first schematic diagram of cross-sectional structures corresponding to steps of a manufacturing method of a semiconductor structure provided in an embodiment of the present disclosure.

Referring to FIG. 2, a substrate 21 is provided. A barrier layer 22 is formed on the substrate 21. A sacrificial layer 23 is formed on the barrier layer 22. An opening pattern 244 is formed over the sacrificial layer 23 by utilizing a photolithography process.

In this embodiment, the substrate 21 is a multi-layer stacked structure. The multi-layer stacked structure includes a conductive structure 210, a second medium layer 213, a second support layer 214, a first medium layer 215, and a first support layer 216 stacked in this order in a same direction. The first support layer 216 and the second support layer 214 play a supporting role in the substrate 21, to prevent the substrate 21 from collapsing in the process of forming capacitor holes. The conductive structure 210 includes an insulating medium 211 and conductive layers 212. The material of the conductive layer 212 includes tungsten or tungsten compound.

In this embodiment, the barrier layer 22 is used as an etch stop layer so that the etching process stops etching after the sacrificial layer 23 is penetrated and a surface of the barrier layer 22 is exposed, to avoid etching by mistake of the substrate 21 caused by the etching process and thus ensuring that the substrate 21 has good performance.

In this embodiment, the etch selectivity ratio of the sacrificial layer 23 to the barrier layer 22 is greater than 100. The material of the sacrificial layer 23 includes carbon-containing materials which include organic carbide (such as resin) and inorganic carbide (such as silicon carbide). The material of the barrier layer 22 includes titanium nitride.

In this embodiment, the hardness of the sacrificial layer is less than that of the hard mask layer formed subsequently. In this way, it is beneficial to avoid etching defects caused by too high hardness of the material. When the sacrificial layer 23 is etched to form trenches, it can be ensured that the formed trenches have a preset topography.

In this embodiment, before the photolithography process is performed to form the opening pattern 244, a pattern transfer layer 24 is formed on the sacrificial layer 23. The pattern transfer layer 24 includes an isolation layer 241, an anti-reflection coating layer 242, and a photoresist layer 243 stacked in this order in a direction away from the substrate 21. The isolation layer 241 is configured to isolate the sacrificial layer 23 from the photoresist layer 243, to prevent a removal process of the photoresist layer 243 from damaging the sacrificial layer 23 or changing the material properties of the sacrificial layer 23.

The removal process of the photoresist layer 243 includes an ashing process, which is typically configured to remove carbides such as the organic materials. When the material of the sacrificial layer 23 is a carbide material that will be affected by the ashing process, the isolation layer 241 with a certain thickness is adopted to isolate the sacrificial layer 23 from the photoresist layer 243, which is beneficial to avoid damage to the sacrificial layer 23 caused by the ashing process, removing of a portion of the sacrificial layer 23 or change of the material performance of the sacrificial layer 23, so as to ensure that the first trench formed subsequently has a better topography.

Further, when the material of the sacrificial layer 23 is polysilicon, the isolation layer 241 is adopted for isolation, which is beneficial to prevent the ashing process from oxidizing polysilicon to form silicon dioxide, thereby ensuring that the sacrificial layer 23 has preset physical properties, especially the hardness property.

Accordingly, when the ashing process does not cause damage to the material of the sacrificial layer 23 and does not change the material properties of the sacrificial layer 23, the isolation layer 241 may not be required. The material of the isolation layer 241 includes at least one of nitride or silicide.

Figure 3:
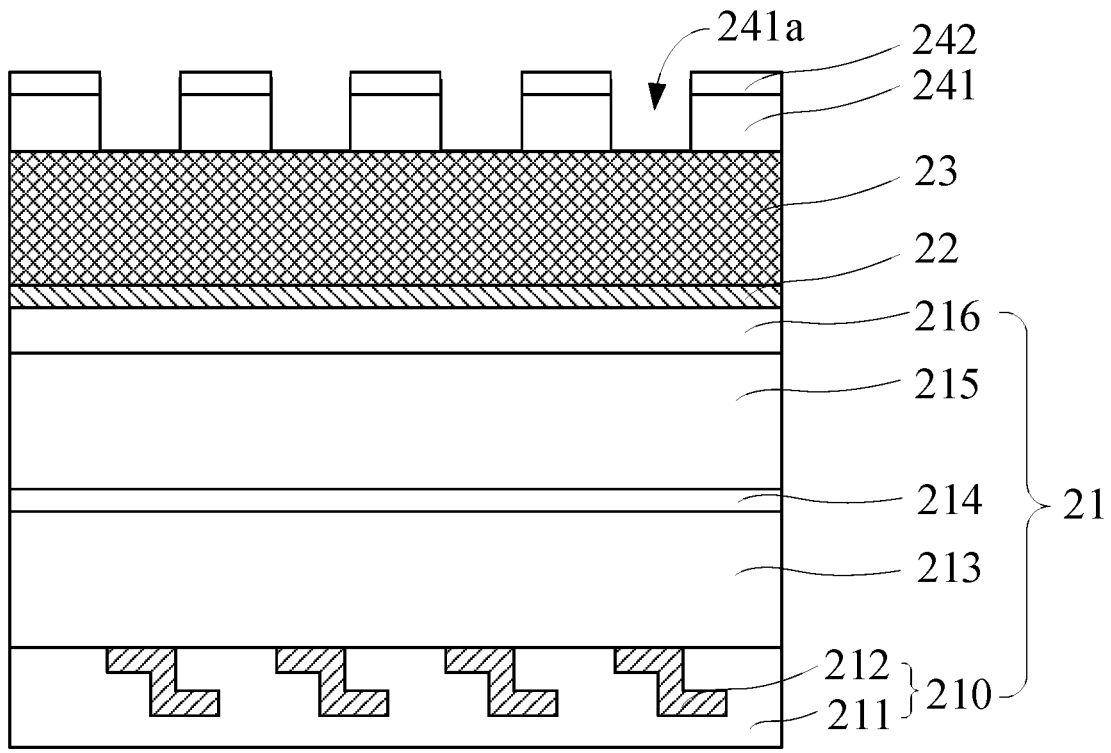
FIG. 3 is a second schematic diagram of cross-sectional structures corresponding to steps of a manufacturing method of a semiconductor structure provided in an embodiment of the present disclosure.

Referring to FIG. 3, after the opening pattern 244 (referring to FIG. 2) is formed in the photoresist layer 243 (referring to FIG. 2), pre-openings 241a are formed in the anti-reflection coating layer 242 and the isolation layer 241 according to the opening pattern 244, and the photoresist layer 243 is removed after the pre-openings 241a are formed.

Since the sacrificial layer 23 needs to be etched subsequently to form first trenches, and the area of sidewalls of the first trench is typically larger than the area of a bottom surface of the pre-opening 241a, the formation of the first trench will increase an exposed area of the sacrificial layer 23. The exposed area refers to the area exposed to the air or process environment. For example, the ashing process is dry etching performed by ionizing the oxygen source gas to form oxygen plasma, and the exposed area is an area that may be contacted with the oxygen plasma or the oxygen source gas.

Removing the photoresist layer 243 in advance enables the etchant in the removal process of the photoresist layer 243 to only contact the area of bottom surface of the pre-opening 241a, instead of contacting the material of the sacrificial layer 23 at the sidewalls of the first trench. In this way, even if the etchant may damage, remove or modify the material of a portion of the sacrificial layer 23 at the bottom of the pre-opening 241a to form a certain etching defect, this etching defect will also be subsequently eliminated when the sacrificial layer 23 is etched through the pre-opening 241a to form the first trench, without casing the topography of the first trench formed to deviate from the preset topography due to damage to, removing of or modification of the material of the sacrificial layer 23 at the sidewalls of the first trench, so as to ensure that the topography of the first trench is accurate and complete.

When the ashing process does not affect the sacrificial layer 23 and thus the isolation layer 241 does not need to be provided, it is possible to directly form the first trenches in the sacrificial layer 23 through the opening pattern 244 (referring to FIG. 2) provided in the photoresist layer 243 (referring to FIG. 2).

Figure 4:
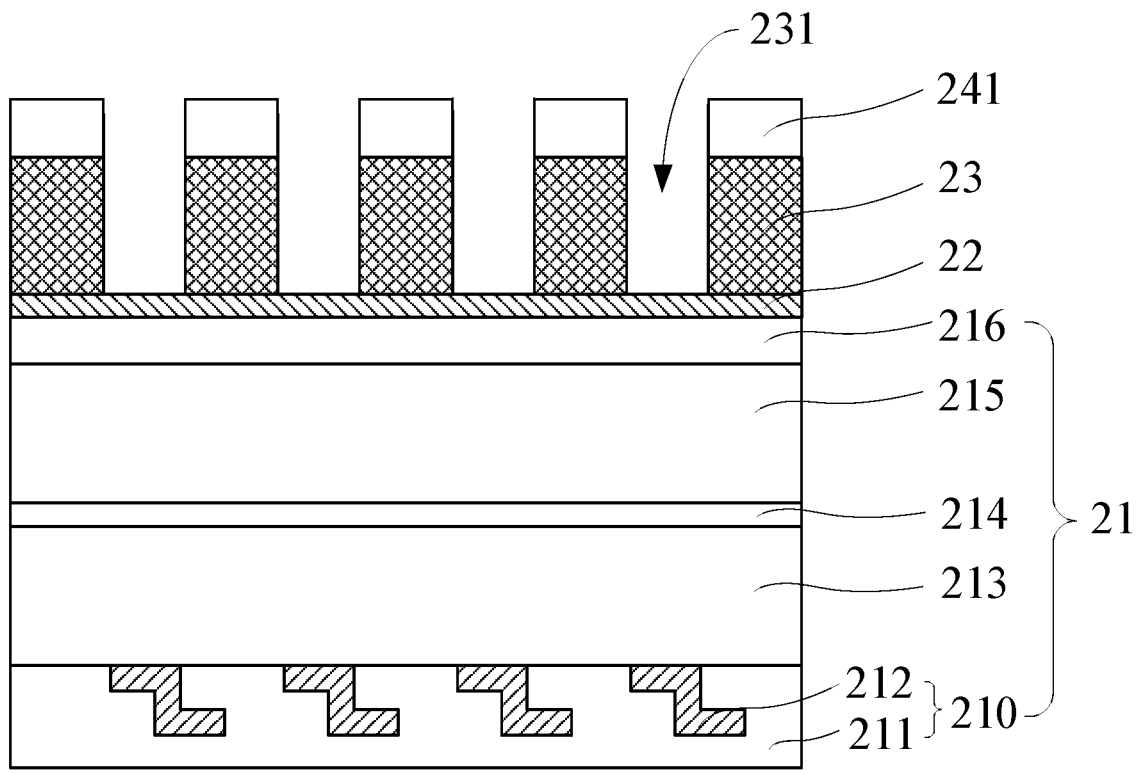
FIG. 4 is a third schematic diagram of cross-sectional structures corresponding to steps of a manufacturing method of a semiconductor structure provided in an embodiment of the present disclosure.

Referring to FIG. 4, the sacrificial layer 23 is etched according to the pre-openings 241a (referring to FIG. 3) by taking the barrier layer 22 as the etch stop layer, to form first trenches 231.

It is to be noted that when the material of the isolation layer 241 has a hardness greater than a hardness of the material of the sacrificial layer 23, a mask-less dry process may be adopted to etch and remove a portion of the sacrificial layer 23 to form the first trenches 231. When the mask-less dry etching process is performed, the anti-reflection coating layer 242 (referring to FIG. 3) at a top surface of the isolation layer 241 will be removed.

In this embodiment, the material of the sacrificial layer 23 is organic carbide. Typically, compared with the inorganic carbide, the organic carbide has a lower hardness, are easier to be etched, and has a better trench topography after being etched. Thus, it is beneficial to shorten the time-consuming of the process and ensure that the trench has a good topography.

Figure 5:
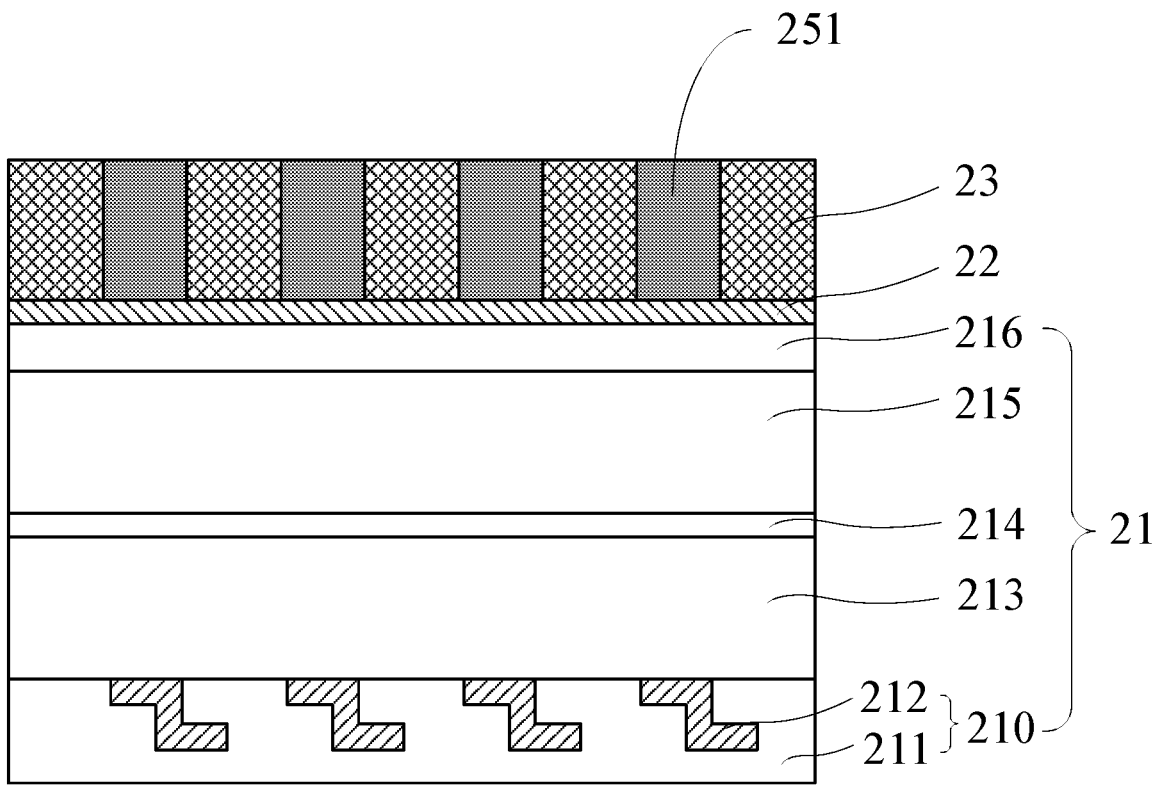
FIG. 5 is a fourth schematic diagram of cross-sectional structures corresponding to steps of a manufacturing method of a semiconductor structure provided in an embodiment of the present disclosure.

Referring to FIG. 5, a medium layer material 251 is filled in each of the first trenches 231 (referring to FIG. 3) and the isolation layer 241 (referring to FIG. 3) is removed.

In this embodiment, the photomask used for the photolithography process is an existing photomask. In a direction perpendicular to a surface of the substrate 21, an orthographic projection of an opening of the existing photomask and an orthographic projection of the conductive layer 212 in the conductive structure 210 are at least partially overlapped, that is, the first trench 231 may be etched to form a capacitor hole exposing the conductive layer 212.

Therefore, in order to ensure that the capacitor hole exposing the conductive layer 212 can be formed by etching the hard mask layer, the medium layer material 251 needs to be filled in the first trench 231 to occupy a physical position, and the etching process is adjusted to selectively etch and remove the sacrificial layer 23 in a certain region, and after the sacrificial layer 23 is etched, the hard mask material is filled to the position in which the original sacrificial layer 23 is located, so that the hard mask material surrounds the medium layer material 251 and is filled between adjacent medium layer materials. In this way, the hard mask layer can be formed after the medium layer material 251 is removed, and the hard mask layer has openings that may be used for etching to form the capacitor holes.

In other embodiments, the material of the hard mask layer may be directly filled in the first trenches, and the sacrificial layer is etched and removed to form the hard mask layer. It is to be noted that in order to ensure that the capacitor hole exposing the conductive layer can be etched through the opening of the hard mask layer, when this technical solution is adopted, the photomask used in the photolithography process is complementary to the existing photomask, that is, the opening positions of the photomasks are opposite.

It is to be noted that when a different photomask is select to form the capacitor holes, in addition to considering the difficulty of obtaining the photomask, the etch selectivity ratio of the material of the sacrificial layer 23 and the hard mask material shall also be considered. When the same etching process has a small etch selectivity ratio of the material of the sacrificial layer and the hard mask material, which may damage, consume, or modify the hard mask material in the process of etching the sacrificial layer 23, the existing photomask may be adopted. In this way, the medium layer material 251 is filled, so that the medium layer material 251 and the material of the sacrificial layer 23 have a larger etch selectivity ratio, as well as the medium layer material 251 and the hard mask material have a larger etch selectivity ratio, to avoid changes of the trench topography by the etching process of etching the sacrificial layer 23 and the medium layer material 251, thereby ensuring that a plurality of discrete capacitor holes can be formed finally.

In this embodiment, the first trench 231 may be filled with the medium layer material 251 first, and then the planarization process may be performed to remove the excess medium layer material 251 and the isolation layer 241. It is also possible to remove the isolation layer 241 first, and then fill the first trench 231 with the medium layer material 251 and perform the planarization process.

In this embodiment, the etch selectivity ratio of the medium layer material 251 to the barrier layer 22 is greater than 100. In this way, it is beneficial to prevent the barrier layer 22 from being etched through and ensure that the performance of the substrate 21 is not affected.

The medium layer material 251 includes one of oxide or nitride, for example, one of silicon oxide, silicon nitride, or silicon oxynitride.

Figure 6:
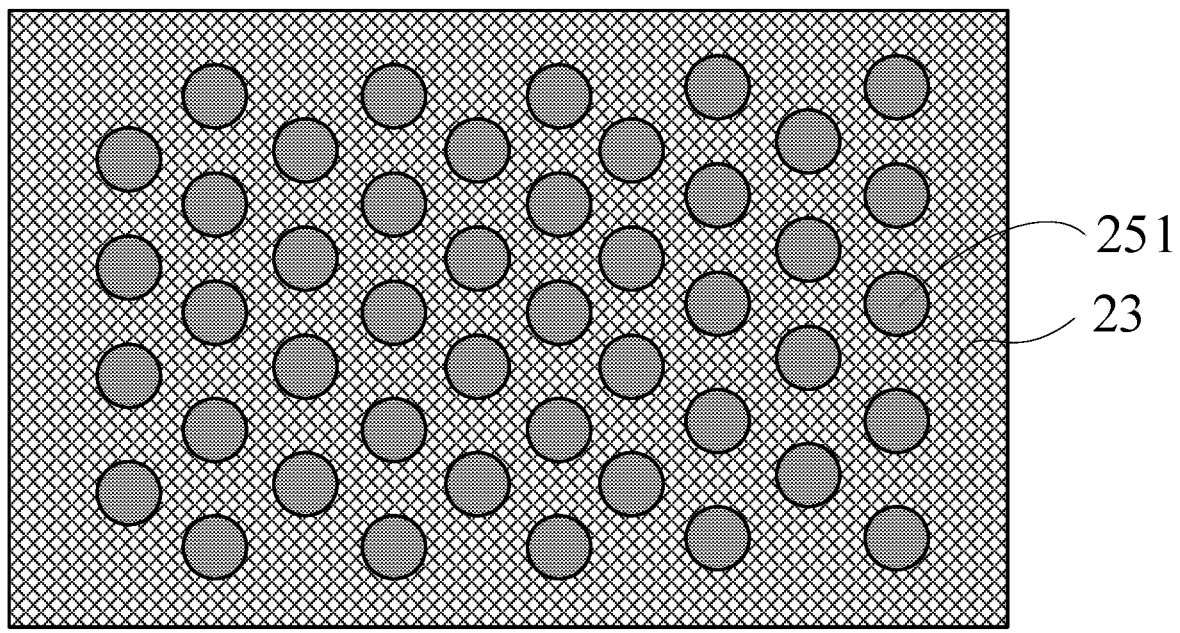
FIG. 6 is a fifth schematic diagram of cross-sectional structures corresponding to steps of a manufacturing method of a semiconductor structure provided in an embodiment of the present disclosure.

Reference is made to FIG. 6, which is a top schematic structural view of the semiconductor structure illustrated in FIG. 5.

The sacrificial layer 23 is a continuous and complete film layer. The medium layer material 251 is located in a plurality of through holes in the sacrificial layer 23, and the arrangement pattern of the through holes is the same as the arrangement pattern of the conductive layers 212.

In this embodiment, the medium layer materials 251 in adjacent rows/columns are arranged in a staggered arrangement, accordingly the conductive layers 212 in adjacent rows/columns are arranged in a staggered arrangement. In this way, it is beneficial to improve the utilization of space, increase the number of through holes/conductive layers 212 that can be formed in the same cross-sectional area, and improve the degree of integration of the semiconductor structure.

In this embodiment, the spacing between adjacent through holes is related to characteristic parameters of the capacitor to be formed later, and the characteristic parameters include the thickness of an electrode layer, the distance between the adjacent electrode layers, and whether the electrode layers are shared. When the spacing between adjacent through holes is controlled, it is necessary to not only ensure that there is a sufficient spacing to form the electrode layer, but also to ensure that the dielectric layer between the adjacent electrode layers will not be broken down or leak electricity due to being too thin, and further to ensure that the capacitance value of the capacitor formed by the electrode layer and the dielectric layer meets the preset requirements.

Further, the spacing between adjacent through holes is also related to the following characteristic parameters which include: the etch selectivity ratio of the sacrificial layer 23 to the barrier layer 22 in the same etching process, the etch selectivity ratio of the medium layer material 251 to the barrier layer 22 in the same etching process, and the thickness of a pillar-shaped capacitor formed subsequently.

Specifically, in the actual manufacturing process of the semiconductor structure, the same etching process has a relatively high etch selectivity ratio of other materials to the barrier layer 22, which only means that the etching rate of the barrier layer 22 by the etchant is relatively low, but the etching will still occur. Therefore, the barrier layer 22 as the etch stop layer will be certainly etched during the process of etching the sacrificial layer 23 and the subsequently etching the medium layer material 251, and as long as the etching occurs, there may be a case of etching by mistake. The degree of etching by mistake is related to the etch selectivity ratio of other materials to the barrier layer 22 in the same etching process, the higher the etch selectivity ratio, the lower the degree of etching by mistake.

In the process of subsequently forming discrete capacitor holes, that is, in the process of etching the barrier layer 22 to expose the conductive layers 212, the etching by mistake in the barrier layer 22 is gradually enlarged, so that the minimum spacing between the adjacent capacitor holes is gradually reduced. At the point, the lower the degree of etching by mistake of the barrier layer 22, the larger the minimum spacing between the adjacent capacitor holes, and the higher the degree of discrete of the adjacent capacitor holes; and the thinner the pillar-shaped capacitor, the lower the degree of magnification of the etching by mistake, and the higher the degree of discrete of the adjacent capacitor holes.

In this embodiment, it is necessary to control the spacing between the adjacent through-holes according to the plurality of characteristic parameters mentioned above, thereby ensuring that adjacent capacitor holes have a relatively high degree of discrete to ensure the performance of the finally formed semiconductor structure.

Figure 7:
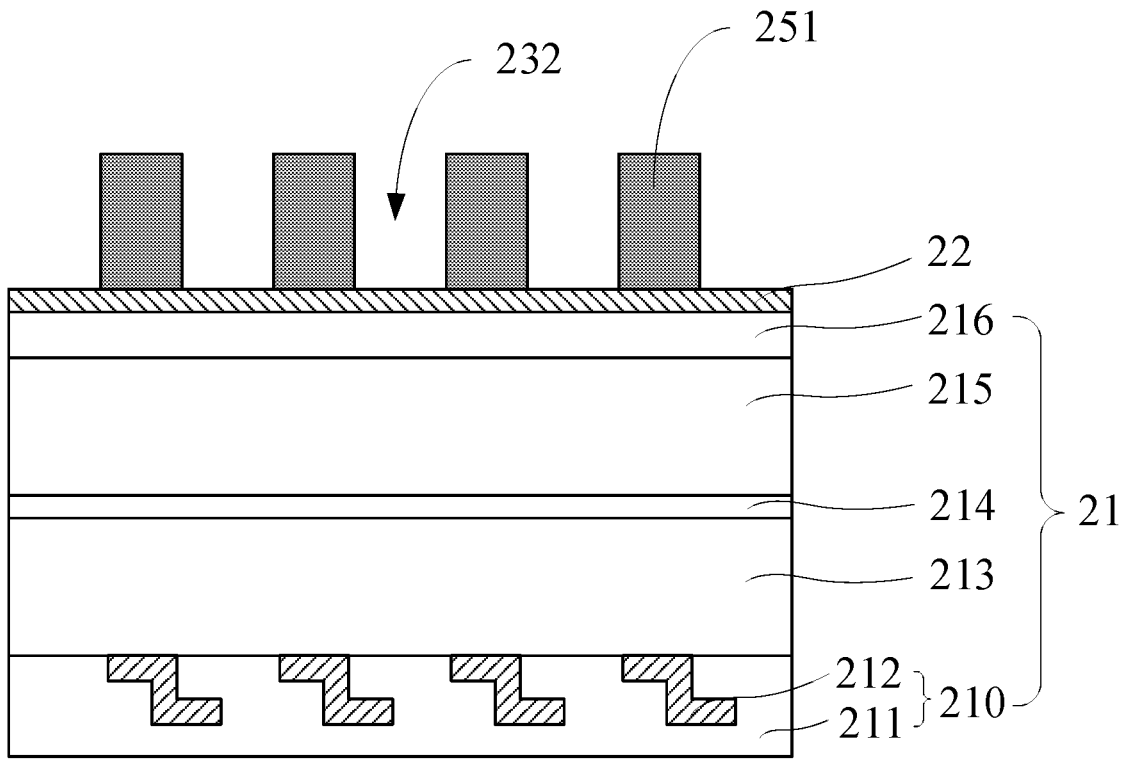
FIG. 7 is a sixth schematic diagram of cross-sectional structures corresponding to steps of a manufacturing method of a semiconductor structure provided in an embodiment of the present disclosure.

Referring to FIG. 7, the sacrificial layer 23 (referring to FIG. 5) is etched by taking the barrier layer 22 as the etch stop layer, to form second trenches 232. The second trench 232 is complementary to the first trench and configured to be filled with the hard mask material.

In this embodiment, the medium layer material 251 and the material of the sacrificial layer 23 have a relatively high selectivity ratio. In this way, when the sacrificial layer 23 is etched, the mask-less dry etching process may be adopted to etch and remove the sacrificial layer 23, without needing to provide an additional photomask and forming an additional mask layer, which is beneficial to reduce process costs and reduce process steps.

Figure 8:
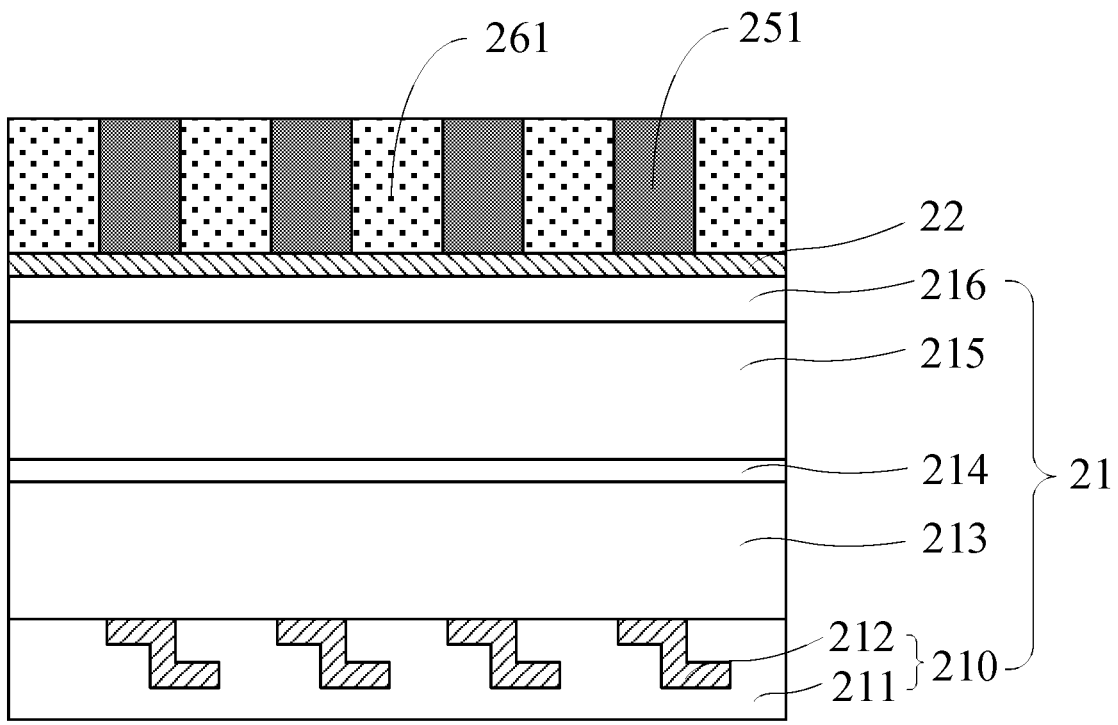
FIG. 8 is a seventh schematic diagram of cross-sectional structures corresponding to steps of a manufacturing method of a semiconductor structure provided in an embodiment of the present disclosure.
Figure 9:
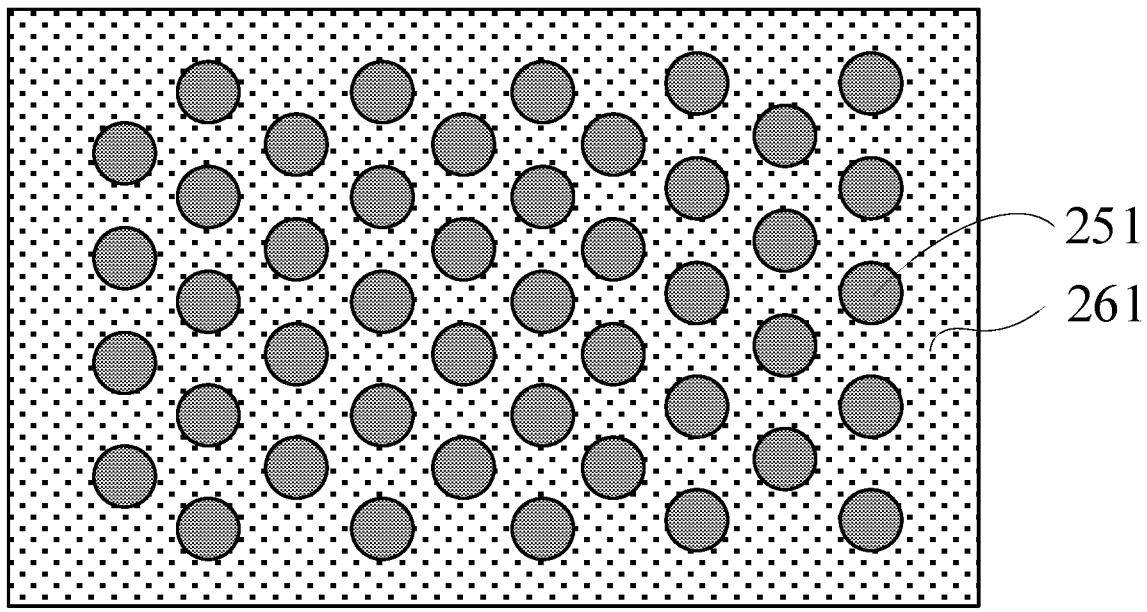
FIG. 9 is an eighth schematic diagram of cross-sectional structures corresponding to steps of a manufacturing method of a semiconductor structure provided in an embodiment of the present disclosure.

Referring to FIG. 8 and FIG. 9, the hard mask material is filled in the second trenches and configured to form a hard mask layer 261.

The hard mask material may be selected according to process requirements which include hardness, the etch selectivity ratio of the medium layer material 251 and so on.

The higher the hardness of the hard mask material, the more difficult it is etched in the process of subsequently forming third grooves. In this way, the hard mask layer formed by the hard mask material may better define an etching direction of the dry etching process to ensure that sidewalls of the third grooves formed by etching are perpendicular to a top surface of the conductive structure 210, so as to ensure that the capacitor holes are discrete. Accordingly, the higher the etch selectivity ratio of the medium layer material 251, in the process of etching the medium layer material 251 to form the hard mask layer 261, the smaller the damage to the hard mask material caused by the etching process, and the higher the verticality of the sidewalls of the hard mask layer 261 with respect to the substrate 21, so that the hard mask layer 261 can better define the etching direction of the dry etching process, thereby ensuring the discrete of the capacitor holes.

Verticality refers to the approach degree of an angle between two straight lines relative to the right angle (i.e., 90 degrees). The higher the verticality, the higher the approach degree, and the lower the verticality, the lower the approach degree.

In this embodiment, the hard mask material includes polysilicon. In other embodiments, the hard mask material also includes an organic material having a relatively high hardness such as polyimide, or the like. Compared with the organic material, the polysilicon is a common material and has a low cost. Using polysilicon as the hard mask material facilitates reducing process costs.

Further, since the organic material as the hard mask material and the organic carbide as the sacrificial layer material belong to carbon-containing compounds, the same etching process may have a relatively low etch selectivity ratio of the two materials, and therefore when the organic material is used as the hard mask material, and the etch selectivity ratio of the two materials is relatively low, it is suitable for forming capacitor holes by adopting the existing photomask. In this way, in the same etching process, the hard mask material and the sacrificial layer material do not exist at the same time, and the type of the medium layer material can be controlled, to increase the etch selectivity ratio of the medium layer material and the hard mask material, and the etch selectivity ratio of the medium layer material and the sacrificial layer material, thereby ensuring that the finally formed hard mask layer has a good sidewall topography, that is, the sidewalls of the hard mask layer have a higher verticality relative to the top surface of the substrate 21.

Accordingly, when the polysilicon is used as the hard mask material, the existing photomask may be used to form the capacitor holes, or another photomask which is complementary to the existing photomask may also be used to form the capacitor holes. When another complementary photomask is selected to form the capacitor holes, since the same etching process has relatively high etch selectivity ratio of the polysilicon and the organic carbide, it is possible to ensure that the sidewalls of the finally formed hard mask layer 261 have a good topography and also to reduce process steps, which facilitate shortening the process cycle.

Figure 10:
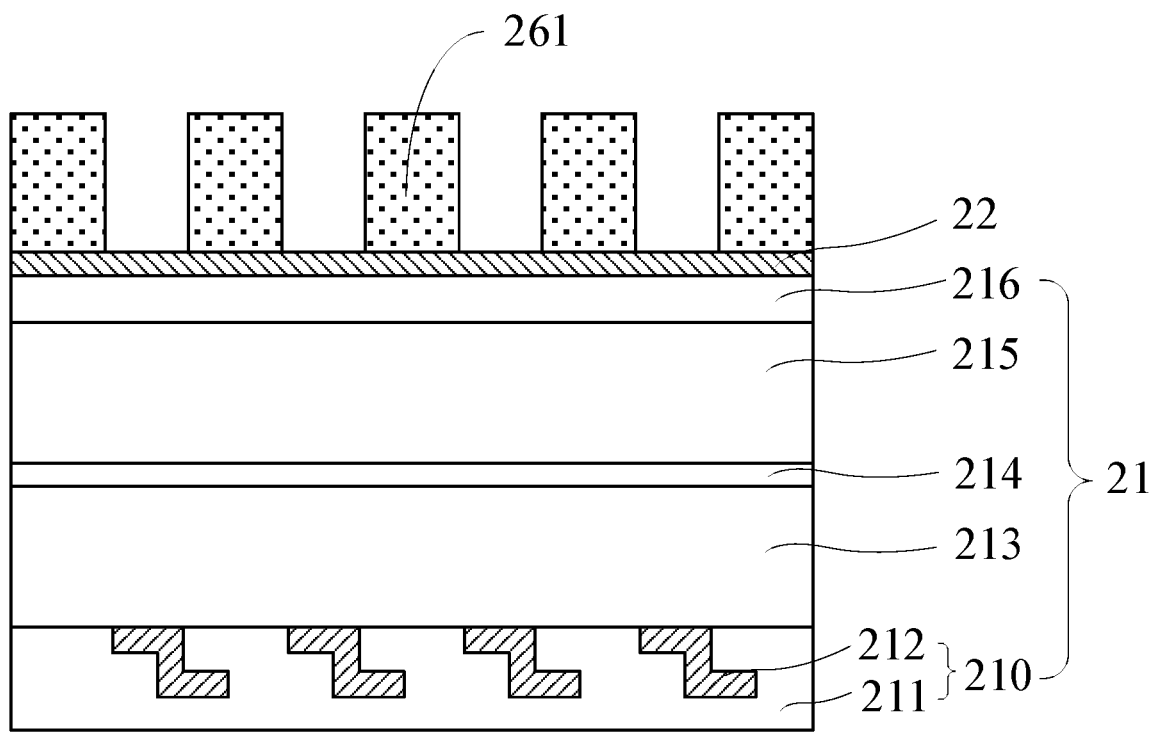
FIG. 10 is a ninth schematic diagram of cross-sectional structures corresponding to steps of a manufacturing method of a semiconductor structure provided in an embodiment of the present disclosure.
Figure 11:
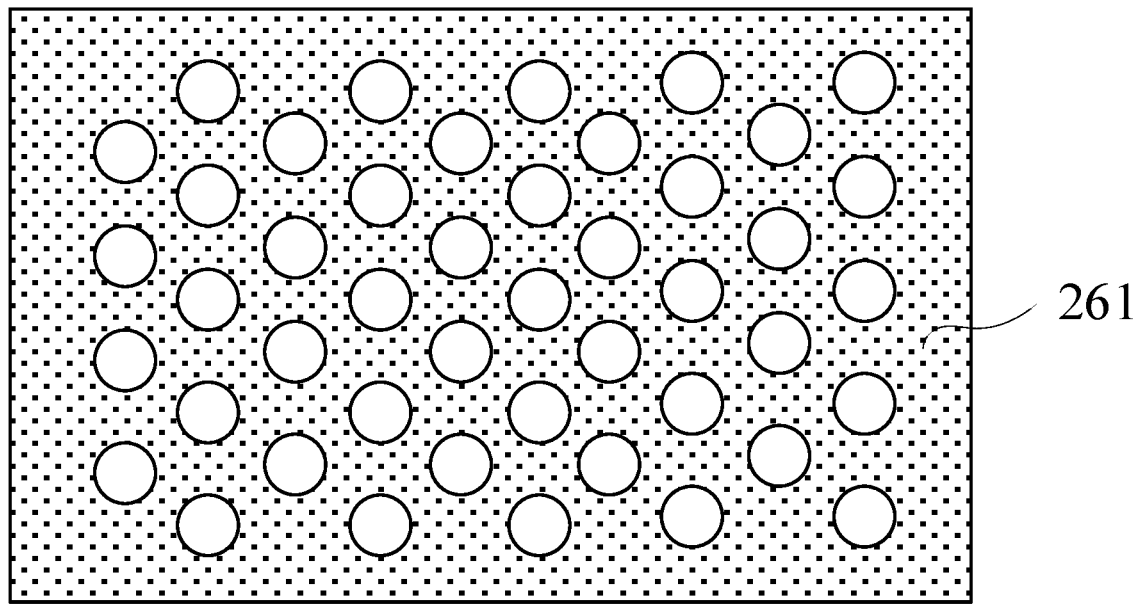
FIG. 11 is a tenth schematic diagram of cross-sectional structures corresponding to steps of a manufacturing method of a semiconductor structure provided in an embodiment of the present disclosure.
Figure 12:
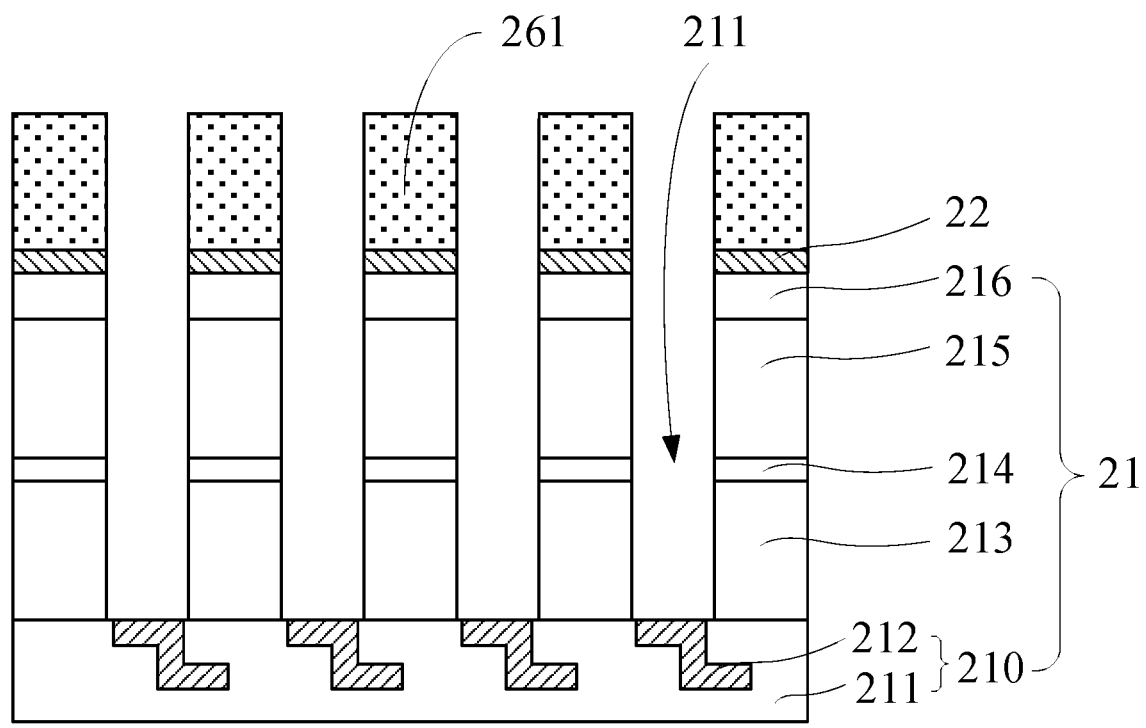
FIG. 12 is an eleventh schematic diagram of cross-sectional structures corresponding to steps of a manufacturing method of a semiconductor structure provided in an embodiment of the present disclosure.

Referring to FIG. 10 and FIG. 11, the medium layer material is etched by taking the barrier layer 22 as the etch stop layer to form the hard mask layer 261. Referring to FIG. 12, the barrier layer 22, the first support layer 216, the first medium layer 215, the second support layer 214, and the second medium layer 213 are etched in this order based on the hard mask layer 261 to form third trenches 211 that expose the conductive layers 212.

In the process of forming the third trenches 211, different etchants may be selected for the material features of the objects to be etched, or the same etchant may also be selected.

Specifically, since the first support layer 216 and the second support layer 214 need to perform a support function, their hardness may be typically larger than that of the materials of the first medium layer 215 and the second medium layer 213. In the process of etching the first support layer 216 and the first medium layer 215, different etchants having different main etching components or different concentrations of the main etching components may be selected, to etch the first support layer 216 and the first medium layer 215 respectively, thereby ensuring a relatively high etch rate of the overall etching process and shortening the process cycle.

In this embodiment, the same etching process has a relatively high etch selectivity ratio of the hard mask layer 261 to the barrier layer 22, to the first support layer 216, to the first medium layer 215, to the second support layer 214, and to the second medium layer 213. When the barrier layer 22, the first support layer 216, the first medium layer 215, the second support layer 214, and the second medium layer 213 are etched, the hard mask layer 261 can always maintain better sidewall topography.

Figure 13:
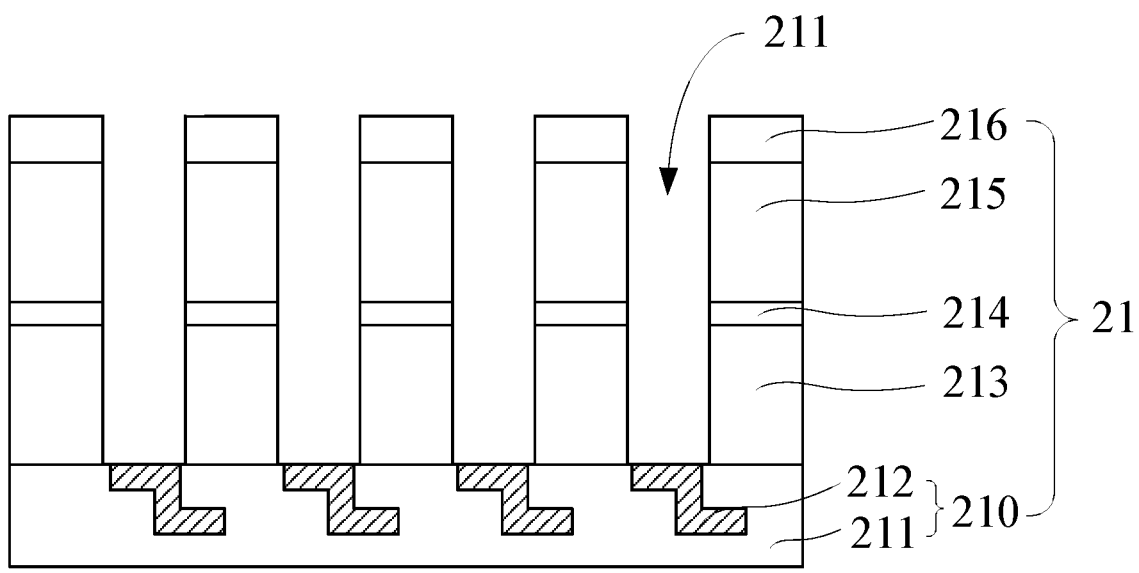
FIG. 13 is a twelfth schematic diagram of cross-sectional structures corresponding to steps of a manufacturing method of a semiconductor structure provided in an embodiment of the present disclosure.

Referring to FIG. 13, the etching process is adopted to remove the hard mask layer 261 (referring to FIG. 12) and the barrier layer 22 (referring to FIG. 12).

It is to be noted that when a specific process of removing the hard mask layer 261 and the barrier layer 22 is selected, it should be considered to avoid generating a relatively large tensile stress, thereby avoiding resulting in the structure collapse or misalignment between adjacent film layers due to excessive tensile stress, so that it is ensured that the sidewalls of the third groove 211 have a relatively high verticality and thus the film layer with a good quality can be formed on the sidewalls and bottom of the third groove 211, and the quality of the finally formed pillar-shaped capacitor structure is improved.

Figure 14:
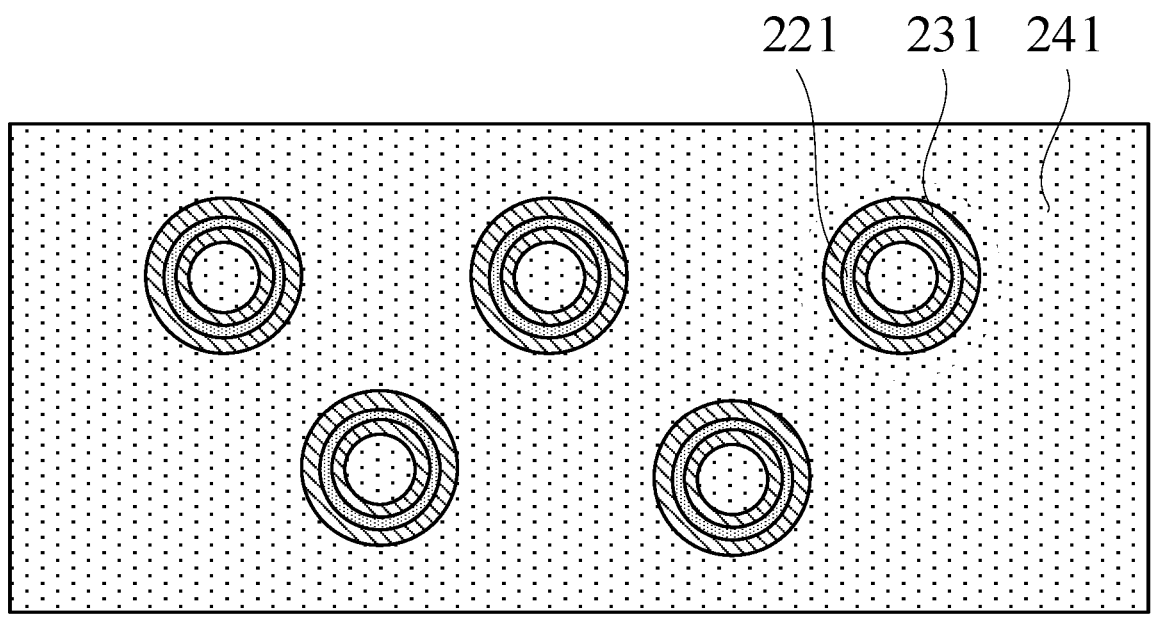
FIG. 14 is a thirteenth schematic diagram of cross-sectional structures corresponding to steps of a manufacturing method of a semiconductor structure provided in an embodiment of the present disclosure.

Referring to FIG. 14, a first conductive layer 221 is formed at the sidewalls and the bottom of the third trench 211 (referring to FIG. 13). A portion of the first support layer, a portion of the first medium layer, a portion of the second support layer, and a portion of the second medium layer are removed. A dielectric layer 231 and a second conductive layer 241 are formed to form a pillar-shaped capacitor structure.

In this embodiment, the pillar-shaped capacitor structure is a two-layered pillar-shaped capacitor structure. Since the outermost side of each two-layered pillar-shaped capacitor structure is the second conductive layer 241, adjacent two-layered pillar-shaped capacitor structures may use a same outermost conductive layer. The process of forming the two-layered pillar-shaped capacitor structure includes the following steps.

After the first conductive layer 221 is formed, all of the first support layer, the first medium layer, the second support layer, and the second medium layer between the adjacent first conductive layers 221 are removed to form a vacant region for providing the second conductive layer 241 and the dielectric layer 231.

In this embodiment, when all materials between the adjacent first conductive layers 221 are etched, the mask-less etching process may be directly adopted, and the photomask does not need to be specially provided, which is beneficial to reduce process costs. Further, a conductive material is filled into the vacant region after etching, so that the second conductive layer 241 that may completely surround the dielectric layer 231 and may be shared by the adjacent pillar-shaped capacitor structure may be formed, which facilitates the improvement of the capacitance and spatial utilization of the pillar-shaped capacitor structure.

In other embodiments, it is also possible to remove a portion of the first support layer, a portion of the first medium layer, and a portion of the second support layer to form the second conductive layer that partially surrounds the dielectric layer, and/or to form the second conductive layer that may not be shared. When this type of pillar-shaped capacitor structure is adopted, other elements may be formed in the medium material that is not occupied by the second conductive layer, thereby improving the integration of the semiconductor structure.

After the removal process is completed, the dielectric layers 231 are respectively formed at inner and outer sidewalls of the first conductive layer 221. After the dielectric layers are formed, a deposition process may be adopted to simultaneously form the second conductive layers 241 inside the dielectric layer 231 and between the adjacent dielectric layers 231, which shortens the process cycle of the semiconductor structure.

In this embodiment, the difficulty of etching the sacrificial layer may be adjusted by controlling the material of the sacrificial layer, and the etch selectivity ratio of the medium layer material and the material of the hard mask layer may be controlled by controlling the material of the medium layer, to avoid damage of the etching process to the hard mask layer and to ensure that the finally formed hard mask layer has a good topography. Further, the barrier layer is formed on the substrate, and the arrangement of the barrier layer facilitates the avoidance of etching by mistake the substrate by the etching process.

Those of ordinary skill in the art can understand that each embodiment is a specific embodiment implementing the present disclosure, and in practical applications, various variations about the form and details can be made thereto without departing from the spirit and scope of the present disclosure. Those skilled in the art may make respective alterations and modifications without departing from the spirit and scope of the present disclosure, so the scope of protection of the present disclosure is determined based on the scope defined in claims.

What is claimed is:

1. A manufacturing method of a semiconductor structure, comprising:
   providing a substrate;
   forming a barrier layer on the substrate;
   forming a sacrificial layer on the barrier layer;
   forming an opening pattern over the sacrificial layer through a photolithography process;
   etching the sacrificial layer according to the opening pattern by taking the barrier layer as an etch stop layer to form first trenches;
   filling a medium layer material in the first trenches;
   etching the sacrificial layer by taking the barrier layer as the etch stop layer to form second trenches;
   filling a hard mask layer material in the second trenches; and
   etching the medium layer material by taking the barrier layer as the etch stop layer to form a hard mask layer.

2. The manufacturing method of the semiconductor structure of claim 1, wherein the sacrificial layer has a hardness less than a hardness of the hard mask layer.

3. The manufacturing method of the semiconductor structure of claim 1, wherein both an etch selectivity ratio of the sacrificial layer to the barrier layer and an etch selectivity ratio of the medium layer material to the barrier layer are greater than 100.

4. The manufacturing method of the semiconductor structure of claim 1, before the opening pattern is formed, further comprising:
   forming a medium layer over the sacrificial layer; the opening pattern being provided in the medium layer.

5. The manufacturing method of the semiconductor structure of claim 1, wherein the barrier layer comprises titanium nitride, the sacrificial layer comprises a carbon-containing material, the medium layer material comprises one of oxide or nitride, and the hard mask layer material comprises polysilicon.

6. The manufacturing method of the semiconductor structure of claim 1, wherein a shape of a projection of the first trench on the barrier layer comprises one of a circle, a square, a regular hexagon, a regular octagon, or a regular hexadecagon.

7. The manufacturing method of the semiconductor structure of claim 1, wherein the substrate comprises:
   a first support layer below the barrier layer;
   a first medium layer below the first support layer;
   a second support layer below the first medium layer;
   a second medium layer below the second support layer; and
   conductive structures below the second medium layer.

8. The manufacturing method of the semiconductor structure of claim 7, wherein the barrier layer, the first support layer, the first medium layer, the second support layer, the second medium layer are etched in this order according to the hard mask layer to form third trenches exposing the conductive structures.

9. The manufacturing method of the semiconductor structure of claim 8, wherein the hard mask layer and the barrier layer are removed by an etching process.

10. The manufacturing method of the semiconductor structure of claim 9, wherein a first conductive layer is formed at sidewalls and a bottom of the third trench; a portion of the first support layer is removed; a portion of the first medium layer is removed; a portion of the second support layer is removed; a portion of the second medium layer is removed; and a dielectric layer and a second conductive layer are formed to form a pillar-shaped capacitor structure.

11. The manufacturing method of the semiconductor structure of claim 10, wherein after the first conductive layer is formed, all of the first support layer, the first medium layer, the second support layer and the second medium layer between adjacent first conductive layers are etched to form a vacant region for providing the second conductive layer and the dielectric layer.

12. The manufacturing method of the semiconductor structure of claim 11, wherein a conductive material is filled into the vacant region after etching, to form the second conductive layer completely surrounds the dielectric layer and is shared by adjacent pillar-shaped capacitor structure.

* * * * *